(12) United States Patent
Kamiya

(10) Patent No.: US 6,869,293 B2
(45) Date of Patent: Mar. 22, 2005

(54) ELECTRONIC DEVICE HAVING INTEGRATED CONNECTOR

(75) Inventor: Arihiro Kamiya, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/364,475

(22) Filed: Feb. 12, 2003

(65) Prior Publication Data

US 2003/0157844 A1 Aug. 21, 2003

(30) Foreign Application Priority Data

Feb. 15, 2002 (JP) ........................................ 2002-037614

(51) Int. Cl.[7] .............................................. H01R 12/00
(52) U.S. Cl. ...................................... 439/76.1; 439/76.2
(58) Field of Search ........................ 439/76.1, 66, 271, 439/78, 474, 76.2

(56) References Cited

U.S. PATENT DOCUMENTS

| | | | | |
|---|---|---|---|---|
| 6,155,856 A | * | 12/2000 | Sanada | ........................ 439/246 |
| 6,244,877 B1 | * | 6/2001 | Asao | .......................... 439/76.2 |
| 6,287,151 B1 | * | 9/2001 | Matsuzaki et al. | ........... 439/630 |
| 6,375,477 B2 | * | 4/2002 | Nishikawa et al. | ......... 439/76.1 |
| 6,464,512 B2 | * | 10/2002 | Morita | ........................ 439/66 |
| 6,494,723 B2 | * | 12/2002 | Yamane et al. | ............. 439/76.2 |
| 6,511,328 B2 | * | 1/2003 | Molus et al. | ............... 439/76.1 |
| 6,540,526 B2 | * | 4/2003 | Toda | ............................ 439/66 |

FOREIGN PATENT DOCUMENTS

JP          A-09-186475          7/1997

* cited by examiner

Primary Examiner—Tho D. Ta
(74) Attorney, Agent, or Firm—Posz & Bethards, PLC

(57) ABSTRACT

An electronic device includes an integrated connector, a printed circuit board (PCB), a case, and a cover. The integrated connector has a connector pin having a first end and a second end. The first end of the connector pin is soldered to the PCB and the second end is arranged so that it is exposed to the outside of the case via a through hole. The second end is loosely fitted to the case so that it is movable in the axial direction. Stresses are less likely to occur in the connector pin even when components of the electronic device expand or contract.

18 Claims, 8 Drawing Sheets

US 6,869,293 B2

ELECTRONIC DEVICE HAVING INTEGRATED CONNECTOR

CROSS REFERENCE TO RELATED APPLICATION

This application is based on and incorporates herein by reference Japanese Patent Application No. 2002-37614 filed on Feb. 15, 2002.

FIELD OF THE INVENTION

The present invention relates to an electronic device having an integrated connector.

BACKGROUND OF THE INVENTION

FIG. 9 shows an electronic device having an integrated connector. In this device, the first end of each connector pin 500 is soldered to a printed circuit board (PCB) 100. The second end is fixed to a case 200 by insert molding and its tip is exposed to the outside of the case 200. Edges of the PCB 100 are sandwiched by the case 200 and a cover 300. The case 200 and the cover 300 are fixed together with mounting screws 600. Therefore, the PCB 100 is fixed between the case 200 and the cover 300.

The electronic device may be exposed to high temperatures when it is installed in an engine compartment. It may be exposed to a temperature of approximately forty degrees Celsius below zero when the vehicle is used in countries that are subject to severe climatic changes, such as Sweden and Russia. Components of the electronic device are made of different kinds of materials having different thermal expansion coefficients. For instance, the case 200 and the connector pins 500 are made of a resin and brass, respectively. When the temperature to which the electronic device is exposed varies greatly, the case 200 and the connector pins 500 expand or contract at different rates. Therefore, stresses are applied to the soldered portions of the connector pins 500 due to the different rates of expansion or contraction between the case 200 and the connector pins 500.

Moreover, the PCB 100 and the cover 300 are made of a resin and metal, respectively. The expansion or contraction rate of the PCB 100 is larger than that of the cover 300. When the PCB 100 expands or contracts, it bends and stresses are applied to the soldered portions of the connector pins 500. The soldered portions of the connector pins 500 are not highly resistant to stress. Therefore, cracks may appear in the soldered portions. If the device is used while the cracks are present, the cracks may become larger and cause electrical failures.

SUMMARY OF THE INVENTION

The present invention therefore has an objective to provide an electronic device having an integrated connector that is resistant to stresses applied to soldered portions of the connector pins. The electronic device of the present invention includes a PCB, a housing, and connector pins. The housing, which is constructed of a case and a cover, houses and holds the PCB. Each connector pin has its first end soldered to the PCB, and its second end exposed to the outside of the case via a through hole. The connector pin is loosely fitted to the case so that it is movable in its axial direction.

Because only the first end of the connector pin is fixed, a stress is less likely to be applied to the connector pin even when the components expand or contract due to temperature changes. That is, a stress is less likely to be applied to the soldered portion of the connector pin.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

The preferred embodiments of the present invention will be explained with reference to the accompanying drawings.

[First Embodiment]

Figure 1A:
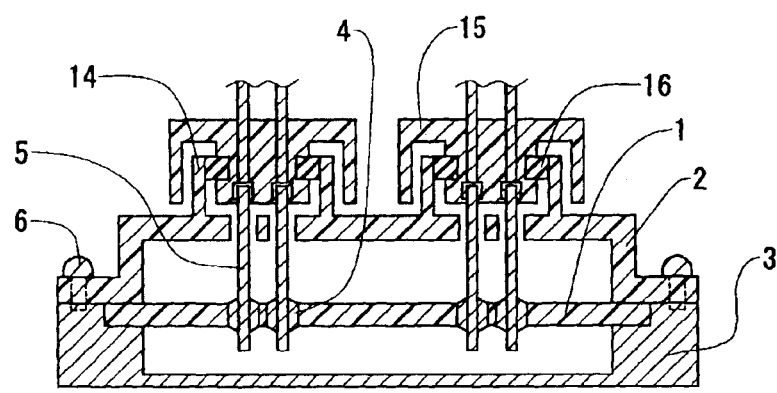
FIG. 1A is a cross-sectional view of an electronic device having integrated connectors according to the first embodiment of the present invention.
Figure 1B:
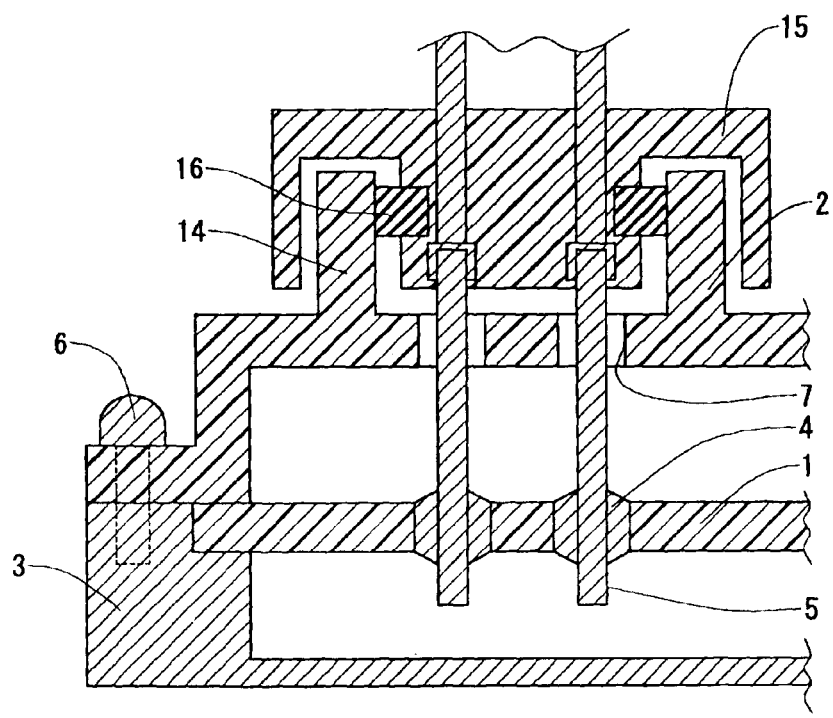
FIG. 1B is an enlarged cross-sectional view of the electronic device shown in FIG. 1A.

Referring to FIG. 1A, an electronic device has a printed circuit board (PCB) 1, a case 2, a cover 3, and connector pins 5. The PCB 1 is made of an epoxy resin with fiber glass and has conductor patterns and electronic components on its surface. The conductor patterns are formed by etching copper foil approximately 35 $\mu$m thick. The PCB 1 includes through holes for connector pins that are made of brass and used for electrical connection with external devices.

The case 2 and the cover 3 hold edges of the PCB between them, and they are fixed together with mounting screws 6, forming a housing of the electronic device. The PCB 1 is housed in the housing. The case 2 is made of a resin having high strength, high stiffness, and resistance to creep, such as polybutylene terphthalate (PBT). Connector housings 14 are connected to the case 2, and female connectors 15 are fitted in the connector housings 14. The cover 3 is made of a resin, which may be the same kind as the case 2 or die-cast aluminum.

Each connector pin has a first end and a second end. The first end that is plated with solder or tin is inserted into the through hole of the PCB 1 and soldered to the PCB 1 with solder 4. During the process of soldering the first end, the connector pin 5 is held in a position perpendicular to a surface of the PCB 1 by a jig. The jig has a closed end hole for holding the first end, and a structural feature for supporting the PCB 1. The solder 4 is eutectic solder that contains tin and lead. The second end of the connector pin 5 is gold-plated and exposed to the outside of the case 2 via a through hole 7. The connector pin 5 is loosely fitted to the case 2.

When the electronic device is installed in an engine compartment, unwanted materials such as water may enter inside of the case 2 through the through hole 7. To solve this problem, rubber seals 16 are fixed to the female connectors 15. The rubber seals 16 work as gaskets to block the unwanted materials from entering a gap between the connector housing 14 and the female connector 15.

The components of the electronic device are made of different kinds of materials with different thermal coefficients. When the components are exposed to sharp temperature changes, they expand or contract at different rates. As a result, stresses are applied to the components. For instance, if the cover 3 is made of aluminum, its expansion or contraction rate is significantly different from the PCB 1 and the case 2 that are made of a resin. Because the PCB 1 and the case 2 are fixed to the cover 3, they will be bent when the expansion or contraction occurs. If the connector pins 5 are fixed to both PCB 1 and case 2, stresses are applied to the fixed portions, in which the connector pins 5 are connected to the PCB 1 and the case 2.

However, the first ends of the connector pins 5 are soldered to the PCB 1, but the second ends are not fixed to the case 2 in this embodiment. Therefore, stresses are less likely to be applied to the soldered portions even though the components including the connector pins 5 expand or contract. That is, stresses are less likely applied to the solder 4.

[Second Embodiment]

Figure 2A:
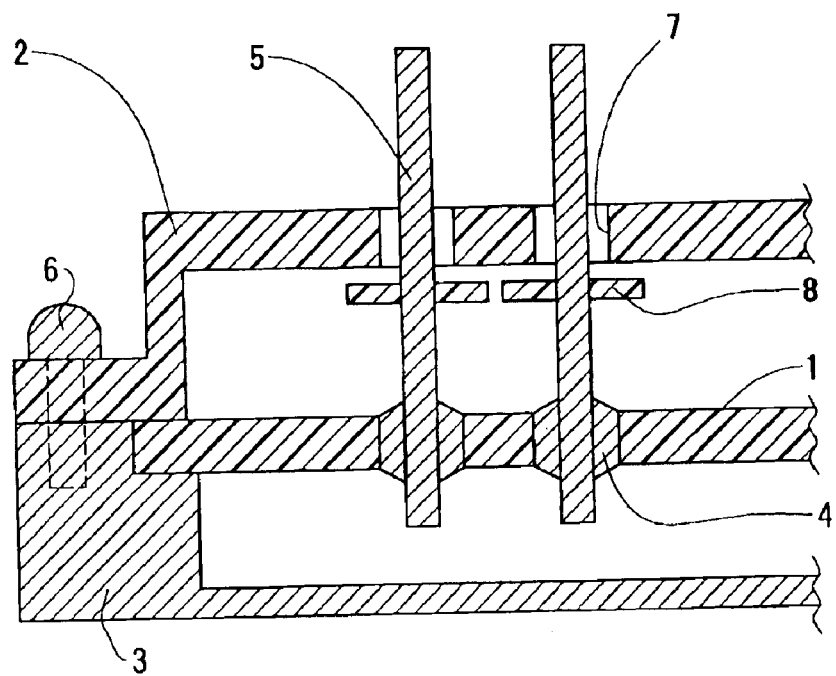
FIG. 2A is an enlarged cross-sectional view of an electronic device according to the second embodiment of the present invention.
Figure 2B:
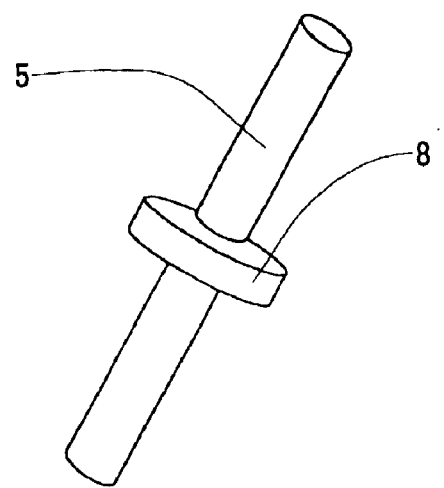
FIG. 2B is a perspective view of a connector pin shown in FIG. 2A.

Referring to FIGS. 2A and 2B, each connector pin 5 has a flange 8, a diameter of which is larger than that of the through hole of the case 2. Although the flange 8 does not have to be made of the same material as the connector pin 5, it needs to be fixed to the connector pin 5.

During the process of soldering the connector pins 5 to the PCB 1, the case 2 is placed so that its inside is visible from the top, and the connector pins 5 are inserted in the through holes 7. The flanges 8 are seated on an inner wall surface of the case 2 and the connector pins 5 remain in that position. The connector pins 5 are inserted into the through holes 7 under this condition. In other words, the connector pins 5 are held in that position so they can be soldered without a jig. This makes the soldering process easier.

If the connector pins 5 are fixed to the PCB 1 and the case 2, stresses may be experienced by the soldered portions. To reduce any stresses, the connector pins 5 are fixed to the PCB 1 in positions so that the flanges 8 and the case 2 do not touch even when the components expand or contract due to temperature changes.

[Third Embodiment]

Figure 3A:
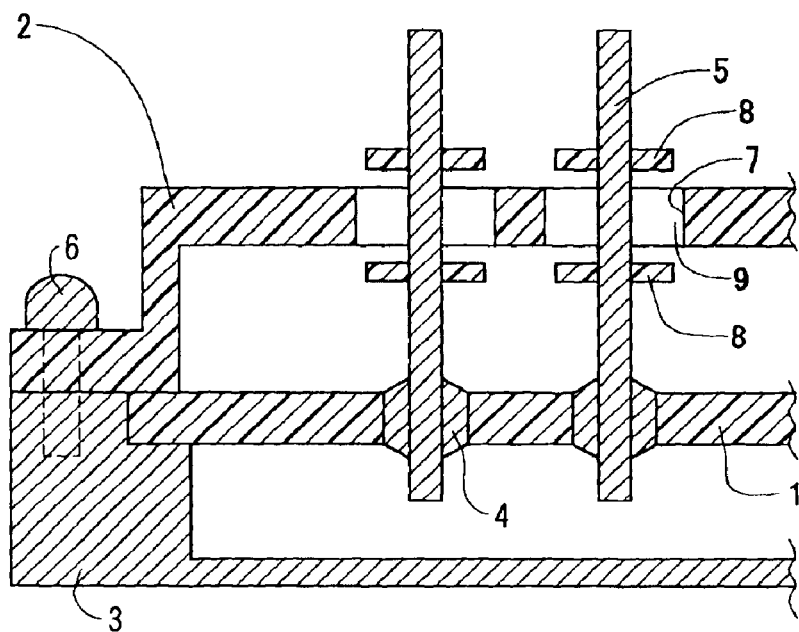
FIG. 3A is an enlarged cross-sectional view of an electronic device according to the third embodiment of the present invention.
Figure 3B:
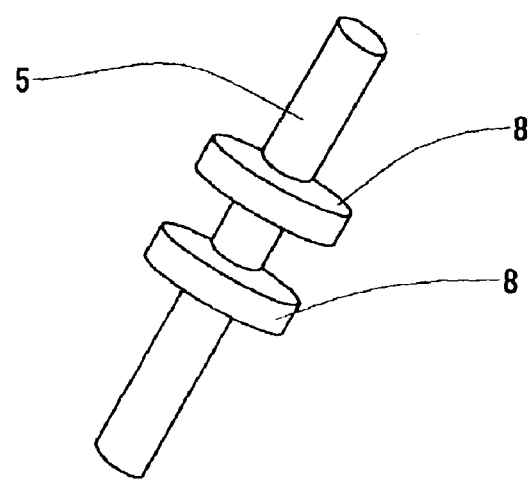
FIG. 3B is a perspective view of a connector pin shown in FIG. 3A.

Referring to FIGS. 3A and 3B, each connector pin 5 has the first flange 8a and the second flange 8b around its outer periphery. The flanges 8a, 8b do not have to be made of the same material as the connector pin 5, but need to be fixed to the connector pin 5. The interval between the first flange 8a and the second flange 8b should be larger than the thickness of the case 2. The interval also should be large enough so that they do not touch the case 2 even when the components of the electronic device expand or contract due to temperature changes.

Figure 4A:
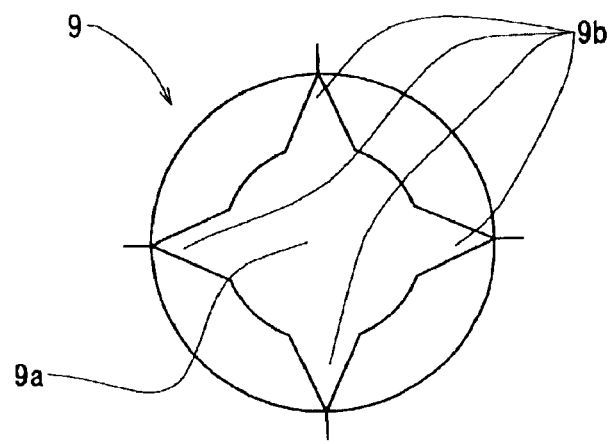
FIG. 4A is a top view of a through hole fitting member according to the third embodiment.
Figure 4B:
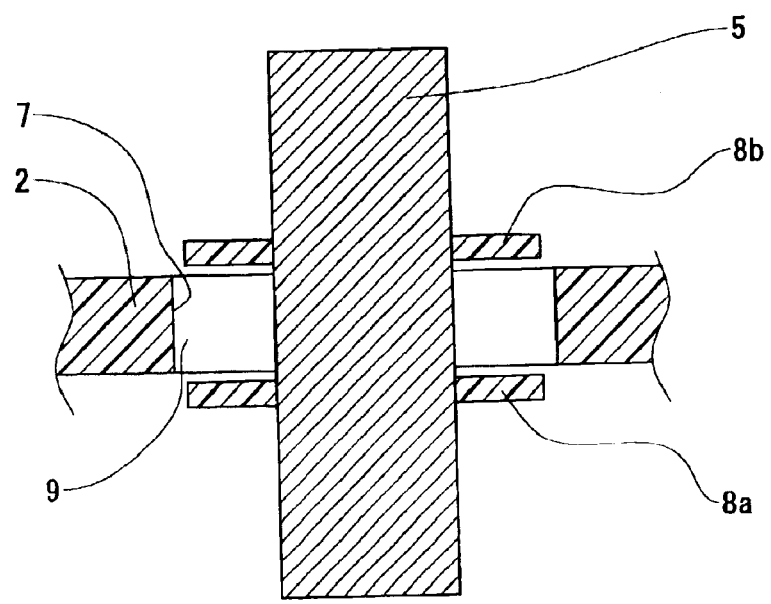
FIG. 4B is an enlarged cross-sectional view around the through hole of a case according to the third embodiment.

Through hole fitting members 9 are provided for each through hole 7, as shown in FIGS. 4A and 4B. Each fitting member 9 has a hole 9a in its center and notches 9b around and merging with the hole 9a. The fitting members 9 are fitted in the through holes 7. The notches 9b are provided so that the first flange 8a is inserted in the housing. The notches may be formed on the inner wall of the case 2. In this case, the fitting members 9 are not needed.

When the first flange 8a is inserted in the housing, the connector pin 5 is positioned so that the fitting member 9 is located between the first flange 8a and the second flange 8b, as shown in FIG. 4B. The connecter pin 5 is supported by the case 2 with the flanges 8a, 8b and is arranged in its correct position. The connector pins 5 do not need to be inserted in the through holes nor soldered one at a time. This makes the soldering process of the connector pins 5 easier.

If the connector pins 5 are fixed to the PCB 1 and the case 2, stresses may be experienced by the soldered portions. To reduce the stresses, the PCB 1 is fixed at a position so that the flanges 8a, 8b and the case 2 do not touch even when the components expand or contract due to temperature changes.

[Fourth Embodiment]

Figure 5A:
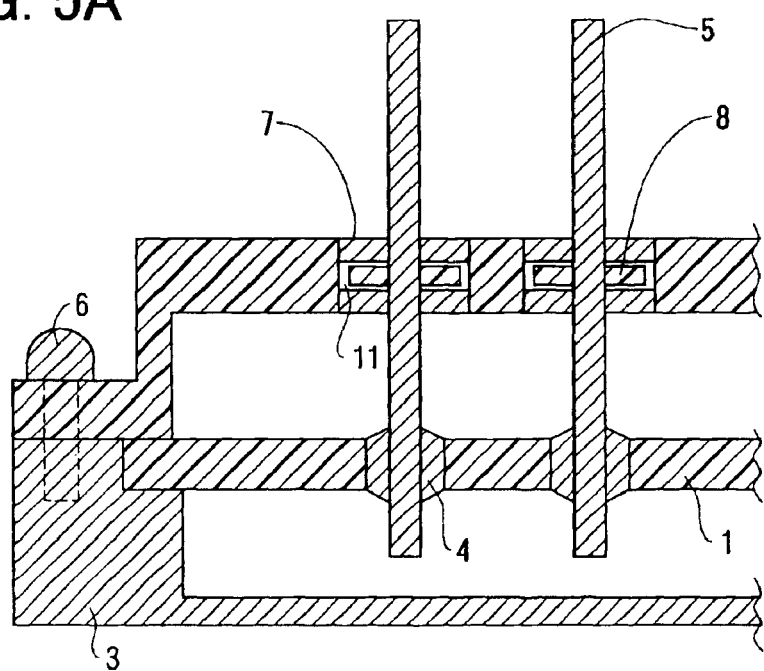
FIG. 5A is an enlarged cross-sectional view of an electronic device according to the fourth embodiment of the present invention.
Figure 5B:
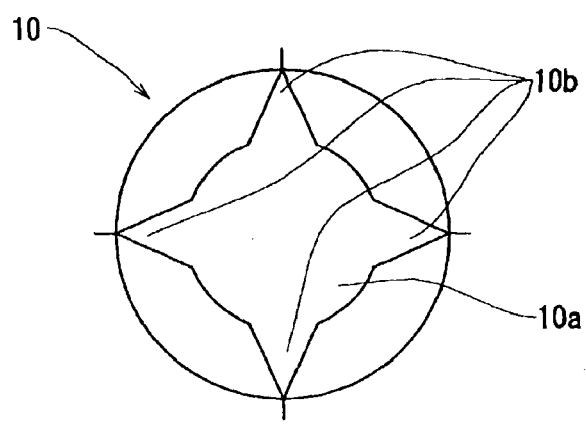
FIG. 5B is a top view of a through hole fitting member according to the fourth embodiment.
Figure 5C:
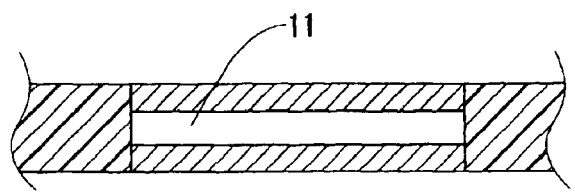
FIG. 5C is an enlarged cross-sectional view around the through hole without the connector pin according to the forth embodiment.

Referring to FIGS. 5A, 5B, and 5C, each connector pin 5 has a flange 8. A pair of through hole fitting members 10 is fitted in each through hole 7 adjacent to the top and the bottom edges of the through hole 7. The fitting member 10 has a hole 10a in the center and notches 10b around it that merge with the hole 10a. The notches 10b are provided so that the flange 8 can be inserted in the housing through the hole 10a and the notches 10b of the fitting member 10.

The flange 8 is positioned in a space 11 between the fitting members 10. The distance between the fitting members 10 is larger than the thickness of the flange 8. Furthermore, the distance is larger enough so that the flange 8 and the fitting members 10 do not touch even when the components expand or contract due to temperature changes.

When the flange 8 is placed in the space 11, the connector pin 5 is supported by the fitting members 10 and is in its correct position. The connector pins 5 do not need to be inserted in the through holes nor soldered one at a time. This makes the soldering process of the connector pins 5 easier.

If the connector pins 5 are fixed to the PCB 1 and the case 2, stresses may be experienced by the soldered portions. To reduce the stresses, the PCB 1 is fixed at a position so that the flange 8 and the fitting members 10 do not touch even when the components expand or contract due to temperature changes.

[Fifth Embodiment]

Figure 6A:
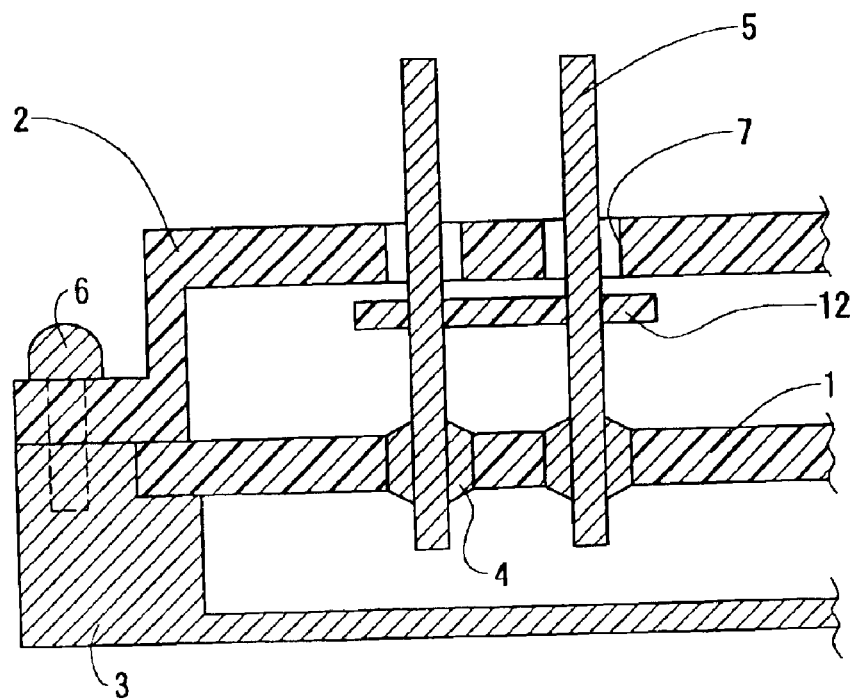
FIG. 6A is an enlarged cross-sectional view of an electronic device according to the fifth embodiment of the present invention.
Figure 6B:
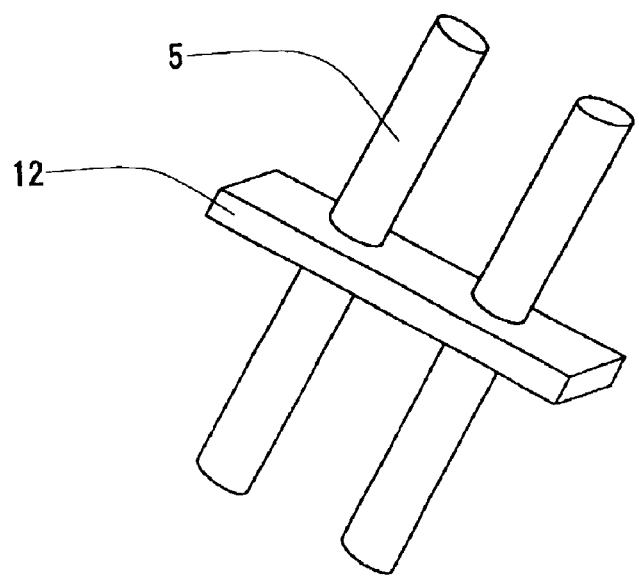
FIG. 6B is a perspective view of connector pins and a plate according to the fifth embodiment.

Referring to FIGS. 6A and 6B, a rectangular plate 12 is provided for holding two connector pins 5. The plate 12 has a longitudinal length longer than the distance between the furthest points on the edges of two through holes 7, in which the connector pins 5 are inserted. The plate 12 is positioned a predetermined distance away from the case 2 in the axial direction of the connector pins 5 so that they do not touch even when the components expand or contract.

During the process of soldering the connector pins 5 to the PCB 1, the case 2 is placed so that its inside is visible from the top. The connector pins 5 are inserted in the through holes 7 when the case 2 is in that position. When the connector pins 5 are inserted in the through holes 7, the plate 12 seats on an inner wall surface of the case 2. Therefore, the connector pins 5 are arranged in their correct positions. This makes insertion of the connector pins 5 for soldering easier.

If the connector pins 5 are fixed to the PCB 1 and the case 2, stresses may be experienced by the soldered portions. To reduce the stresses, the connector pins 5 are fixed to the PCB 1 in a position that the plate 12 and the case 2 do not touch even when the components expand or contract due to temperature changes.

[Sixth Embodiment]

Figure 7:
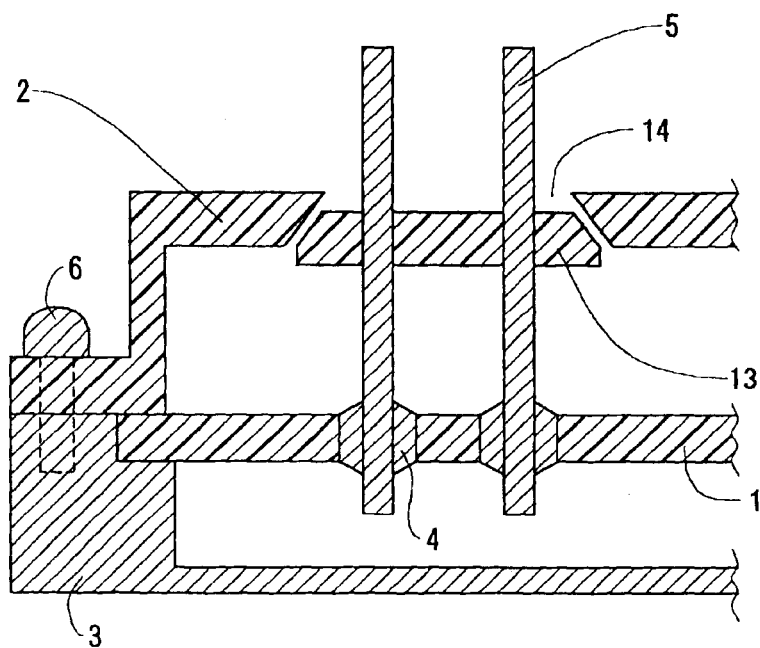
FIG. 7 is an enlarged cross-sectional view of an electronic device according to the sixth embodiment of the present invention.

Referring to FIG. 7, a cover 2 has a tapered through hole 14 so that the diameter of the top of the hole 7 is smaller than that of the bottom of the hole 7. A tapered plate 13 is provided for holding the connector pins 5. The edges of the plate 13 are tapered so that they correspond to the tapered edges of the through hole 14. The connector pins 5 are fixed to the plate 13 by insert molding at an interval corresponding to the interval between through holes of the PCB 1.

Because the cover 2 and the tapered plate 13 are formed so that they fit each other, the tapered plate 13 is easily arranged in its correct position. As a result, the connector pins 5 are easily arranged in the positions corresponding to the through holes of the PCB 1. This makes insertion of the connector pins 5 to the through holes easier.

[Seventh Embodiment]

Figure 8:
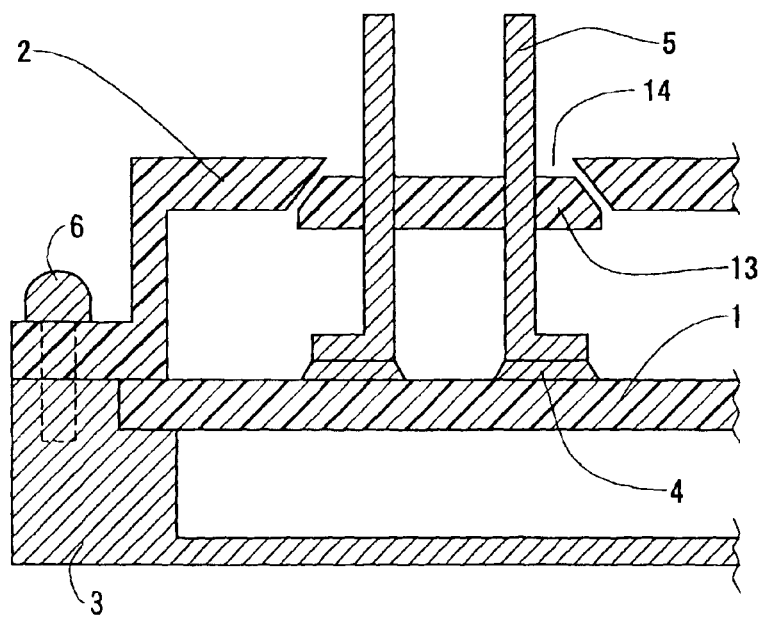
FIG. 8 is an enlarged cross-sectional view of an electronic device according to the seventh embodiment of the present invention.
Figure 9:
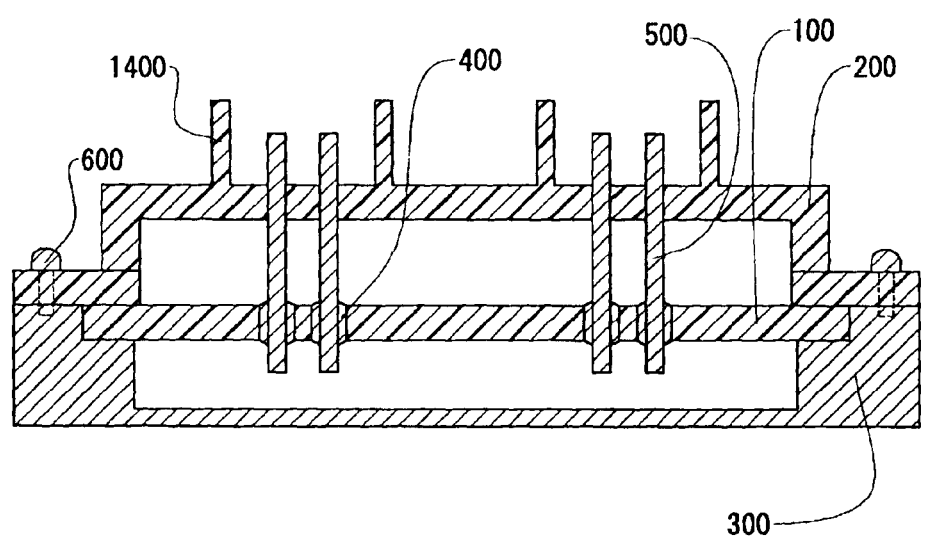
FIG. 9 is a related art, cross-sectional view of an electronic device having integrated connectors.

Referring to FIG. 8, the first ends of the connector pins 5 are bent along an adjacent surface of the PCB 1. The bent portions of the connector pins 5 are soldered to the PCB 1. With this configuration, the through holes of the PCB 1 and the process of inserting the connector pins 5 into the thorough holes are not required. Furthermore, the area for soldering increases. Therefore, the strength of the soldered portions increases.

The present invention should not be limited to the embodiment previously discussed and shown in the figures, but may be implemented in various ways without departing from the spirit of the invention. For example, the plate 12 is not limited to the rectangular shape. It can be a disk shape or other shapes as long as it can be supported by the case 2 when the case is placed so that its inside is visible from the top.

What is claimed is:

1. An electronic device having an integrated connector comprising:
    a printed circuit board on which conductor patterns are printed;
    a housing constructed of a case defining a through hole and a cover for housing and fixing the printed circuit board; and
    a plurality of connector pins, each of which has a first end soldered to the printed circuit board and a second end exposed to an outside of the case via the through hole, the second end having a straight shape for fitting into a female connector, wherein each connector pin is loosely fixed to the case at the through hole so that the connector pin is movable in an axial direction thereof when expanding or contracting due to thermal variation,
    wherein:
        each connector pin has a flange with a diameter that is larger than the through hole;
        the flange seats on a surface of the case around the through hole; and
        the connector pin is arranged in the printed circuit board.

2. An electronic device having an integrated connector comprising:
    a printed circuit board on which conductor patterns are printed;
    a housing constructed of a case defining a through hole and a cover for housing and fixing the printed circuit board;
    a plurality of connector pins each of which has a first end soldered to the printed circuit board and a second end exposed to an outside of the case via the through hole, the second end having a straight shape for fitting into a female connector, wherein each connector pin is loosely fixed to the case at the through hole so that the connector pin is movable in an axial direction thereof when expanding or contracting due to thermal variation; and
    a through hole fitting member defining a hole and a notch merging with the hole, wherein:
    each connector pin has two flanges, with flange diameters larger than the through hole;
    the flanges are arranged at an interval larger than a thickness of the case;
    one of the flanges is inserted in the case through the hole and the notch; and
    the flanges are positioned on each side of the case.

3. The electronic device according to claim 2, wherein the flanges are located so that a predetermined distance is provided between the flanges and the case.

4. An electronic device having an integrated connector comprising:
    a printed circuit board on which conductor patterns are printed;
    a housing constructed of a case defining a through hole and a cover for housing and fixing the printed circuit board;
    a plurality of connector pins, each of which has a first end soldered to the printed circuit board and a second end exposed to an outside of the case via the through hole, the second end having a straight shape for fitting into a female connector wherein each connector pin is loosely fixed to the case at the through hole so that the connector pin is movable in an axial direction thereof when expanding or contracting due to thermal variation; and
    a plurality of through hole fitting members, wherein:
    each connector pin has a flange;
    at least one of the through hole fitting members has a hole and a notch merging with the hole;
    the through hole fitting members are fitted in the through hole adjacent to a top edge and a bottom edge of the through hole defining a space between the fitting members;
    the space defined between the through hole fitting members is larger than a diameter of the flange in a radial direction of the through hole and a thickness of the flange in an axial direction of the through hole; and
    the flange is inserted in the space between the through hole fitting members via the hole and the notch of the through hole fitting member that has the hole and the notch.

5. The electronic device according to claim 4, wherein the flange is positioned a predetermined distance away from each through hole fitting member in an axial direction of the connector pin.

6. An electronic device having an integrated connector comprising:
a printed circuit board on which conductor patterns are printed;
a housing constructed of a case defining a through hole and a cover for housing and fixing the printed circuit board;
a plurality of connector pins, each of which has a first end soldered to the printed circuit board and a second end exposed to an outside of the case via the through hole, the second end having a straight shape for fitting into a female connector, wherein each connector pin is loosely fixed to the case at the through hole so that the connector gin is movable in an axial direction thereof when expanding or contracting due to thermal variation; and
a plate for holding at least two connector pins, wherein the connector pins are arranged by the plate,
wherein the plate is positioned a predetermined distance away from the case in an axial direction of the connector pins.

7. An electronic device having an integrated connector comprising:
a printed circuit board on which conductor patterns are printed;
a housing constructed of a case defining a through hole and a cover for housing and fixing the printed circuit board; and
a plurality of connector pins, each of which has a first end soldered to the printed circuit board and a second end exposed to an outside of the case via the through hole, the second end having a straight shape for fitting into a female connector, wherein each connector pin is loosely fixed to the case at the through hole so that the connector pin is movable in an axial direction thereof when expanding or contracting due to thermal variation; and
a plate for holding at least two connector pins, wherein the connector pins are arranged by the plate,
wherein:
the case has tapered edges so that a diameter of the through hole on a top surface of the case is smaller than a diameter of the through hole on a bottom surface;
the plate is positioned a predetermined distance away from the case in an axial direction of the connector pins; and
the plate is tapered around the through hole corresponding to the tapered edges of the case.

8. An electronic device having an integrated connector comprising:
a printed circuit board on which conductor patterns are printed;
a housing constructed of a case defining a through hole and a cover for housing and fixing the printed circuit board; and
a plurality of connector pins, each of which has a first end soldered to the printed circuit board and a second end exposed to an outside of the case via the through hole, the second end having a straight shape for fitting into a female connector, wherein each connector pin is loosely fixed to the case at the through hole so that the connector pin is movable in an axial direction thereof when expanding or contracting due to thermal variation,
wherein:
the case has a notch around and merging with the through hole;
each connector pin has two flanges, with flange diameters larger than the through hole;
the flanges are arranged at an interval larger than a thickness of the case;
one of the flanges is inserted in the case through the through hole and the notch; and
the flanges are positioned on each side of the case.

9. An electric device having an integrated connector comprising:
a printed circuit board;
a case having a through hole defined thereon; and
a plurality of connector pins, each of the plurality of connector pins having a first end soldered to the printed circuit board and a second end having a straight shape for fitting into a female connector, the second end extending non-fixedly through the case via the through hole such that the each of the plurality of connector pins is movable in an axial direction through the through hole when expanding or contracting due to thermal variation,
wherein:
the each of the plurality of connector pins includes a flange having a diameter relative to an axial center of the each, the diameter of the through hole; and
the flange seats on a surface of the adjacent to the through hole.

10. An electronic device having an integrated connector comprising:
a printed circuit board;
a case having a through hole defined thereon;
a plurality of connector pins, each of the plurality of connector pins having a first end soldered to the printed circuit board and a second end having a straight shape for fitting into a female connector, the second end extending non-fixedly through the case via the through hole such that the each of the plurality of connector pins is movable in an axial direction through the through hole when expanding or contracting due to thermal variation; and
a through hole fitting member defining a hole and a notch merging with the hole, wherein:
the each of the plurality of connector pins includes a flange having relative diameters relative to an axial center of the each, the respective diameter larger than a diameter of the through hole;
the two flange are spaced at an interval larger than a thickness of the case;
one of the flanges is inserted in the case through the hole and the notch; and
the two flanges are positioned on respective sides of the case.

11. The electronic device according to claim 10, wherein the two flanges are located so that a predetermined distance is provided between the two flanges and the case.

12. An electronic device having an integrated connector comprising:
a printed circuit board;
a case having a through hole defined thereon;
a plurality of connector pins, each of the plurality of connector pins having a first end soldered to the printed circuit board and a second end having a straight shape for fitting into a female connector, the second end extending non-fixedly through the case via the through hole such that the each of the plurality of connector pins is movable in an axial direction through the through hole when expanding or contracting due to thermal variation; and a plurality of through fitting members, wherein:
each of the plurality of connector pins include a flange;
the plurality of through hole fitting members defining a hole and a notch merging with the hole;
the through hole fitting members are fitted in the through hole adjacent to a top edge and a bottom edge of the through hole defining a space between each of the plurality of through hole fitting members;
the space defined between the each of the through hole fitting members is larger than a radial diameter of the flange relative to an axial center of the through hole and a thickness of the flange in an axial direction of the through hole; and
the flange is inserted in the space between the through hole fitting members via the hole and the notch of the through hole fitting member.

13. The electronic device according to claim 12, wherein the flange is positioned a predetermined distance away from each through hole fitting member in an axial direction of the connector pin.

14. The An electronic device having an integrated connector comprising:
a printed circuit board;
a case having a through hole defined thereon;
a plurality of connector pins, each of the plurality of connector pins having a first end soldered to the printed circuit board and a second end having a straight shave for fitting into a female connector, the second end extending non-fixedly through the case via the through hole such that the each of the plurality of connector pins is movable in an axial direction through the through hole when expanding or contracting due to thermal variation; and
a plate for holding at least two connector pins, wherein the connector pins are arranged on the plate
wherein the plate is positioned a predetermined distance away from the case in an axial direction of the connector pins.

15. The electronic device according to claim 14, wherein the plate is positioned a predetermined distance away from the case in an axial direction of the connector pins.

16. The electronic device according to claim 14, wherein the first end of each of the plurality of connector pins is bent along an adjacent surface of the printed circuit board and wherein the first end is soldered to the printed circuit board.

17. The electronic device having an integrated connector comprising:
a printed circuit board;
a case having a through hole defined thereon;
a plurality of connector pins, each of the plurality of connector pins having a first end soldered to the printed circuit board and a second end having a straight shape for fitting into a female connector, the second end extending non-fixedly through the case via the through hole such that the each of the plurality of connector pins is movable in an axial direction through the through hole when expanding or contracting due to thermal variation; and
a plate for holding at least two connector pins, wherein the connector pins are arranged on the plate
wherein:
the plate is positioned a predetermined distance away from the case in an axial direction of the connector pins;
the case includes tapered edges;
a diameter of the through hole on a top surface of the case is smaller than a diameter of the through hole on a bottom surface of the case; and
the plate is tapered around the through hole corresponding to the tapered edges of the case.

18. An electronic device having an integrated connector comprising:
a printed circuit board;
a case having a through hole defined thereon; and
a plurality of connector pins, each of the plurality of connector pins having a first end soldered to the printed circuit board and a second end having a straight shape for fitting into a female connector, the second end extending non-fixedly through the case via the through hole such that the each of the plurality of connector pins is movable in an axial direction through the through hole when expanding or contracting due to thermal variation,
wherein:
the case includes a notch positioned adjacent to and merging with the through hole;
each of the plurality of connector pins includes two flanges having respective diameters relative to an axial center of the each, the respective diameters larger than the through hole;
the two flanges are arranged at an interval larger than a thickness of the case;
one of the flanges is inserted in the case through the through hole and the notch; and
the flanges are positioned on each side of the case.

* * * * *